(12) United States Patent
Bulusu et al.

(10) Patent No.: US 6,520,348 B1
(45) Date of Patent: Feb. 18, 2003

(54) MULTIPLE INCLINED WAFER HOLDER FOR IMPROVED VAPOR TRANSPORT AND REFLUX FOR SEALED AMPOULE DIFFUSION PROCESS

(75) Inventors: Dutt V. Bulusu, Lehigh, PA (US); Robert L. Mcanally, Union, NJ (US); Michael Geva, Lehigh, PA (US); Gustav E. Derkits, Union, NJ (US); Robert A. Resta, Union, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/542,622

(22) Filed: Apr. 4, 2000

(51) Int. Cl.[7] ............................................. A47G 19/08
(52) U.S. Cl. .................................. 211/41.18; 414/938
(58) Field of Search ................................ 206/710, 711, 206/712, 832; 211/41.18; 414/938; 312/31.1; 432/124

(56) References Cited

U.S. PATENT DOCUMENTS

| | | | | |
|---|---|---|---|---|
| 3,984,267 A | | 10/1976 | Craford et al. | |
| 4,355,974 A | * | 10/1982 | Lee | 432/253 |
| 5,054,418 A | * | 10/1991 | Thompson et al. | 118/500 |
| 5,571,744 A | | 11/1996 | Demirlioglu et al. | |
| 5,672,530 A | | 9/1997 | Hsu | |

* cited by examiner

Primary Examiner—John F. Niebling
Assistant Examiner—Christopher Lattin

(57) ABSTRACT

An apparatus and method for diffusion annealing impurities onto a plurality of wafers is described. A hollow wafer holder includes a plurality of first and second slots. The first slots are sized and shaped to receive a pair of wafers. The first slots are angled relative to a longitudinal axis of the wafer holder. The wafer holder is positioned at a first location within an ampoule, with a diffusion source being positioned at a second location within the ampoule. The ampoule is sealed and placed within or near a heat source. The heat source alters the physical state of the diffusion source to allow the entrained impurities to diffuse throughout the ampoule. The inclination of the first slots allows a sufficient clearance between the wafers and the ampoule to allow impurities within a gaseous diffusion source to extend throughout the ampoule. The presence of the second slots allows a more uniform diffusion of the impurities to the wafers.

44 Claims, 5 Drawing Sheets

MULTIPLE INCLINED WAFER HOLDER FOR IMPROVED VAPOR TRANSPORT AND REFLUX FOR SEALED AMPOULE DIFFUSION PROCESS

FIELD OF THE INVENTION

The present invention generally relates to semiconductor wafer processing, and more particularly relates to a method and apparatus for uniformly diffusing an impurity into a plurality of wafers.

BACKGROUND

One step in the processing of semiconductor wafers includes the introduction of impurities into the device wafer. A widely used method for introducing impurities is the diffusion annealing process.

The diffusion annealing process may be performed either in an open tube or a closed tube. In a known open tube diffusion process, the wafers are placed in a holder vertically or perpendicular to the longitudinal axis of the tube, which is generally placed horizontally. The tube and holder are placed within a diffusion furnace into which impurities are introduced in a gas stream.

An open tube diffusion process is generally used for silicon wafers. On the other hand, in the case of compound semiconductors, such as GaAs or InP, which are generally referred to as III–V compounds, surface damage such as pitting may occur to the wafers from the flow of the gaseous impurity sources. This surface damage is due to the more volatile constituent of the compound semiconductor, usually the non metal atom preferentially leaving the surface of the wafers at the elevated temperatures used in diffusion process. Such loss may be exacerbated by a flowing gaseous stream of impurities and may lead to various degrees of surface damage in an open tube diffusion anneal. Moreover, some of the impurities commonly used in III–V semiconductor devices, such as cadmium, are toxic and are not easily adapted for open tube diffusion processing in a safe manner.

In a closed tube diffusion annealing process, wafers are placed within an ampoule along with a solid diffusion source that includes impurities. The ampoule, or tube, is vacuum sealed at both of its ends. Then, the sealed ampoule is placed in a furnace and the temperature is raised to establish a solid-vapor equilibrium to drive the impurities from the vapor phase into the wafers. To prevent surface damage or pitting, it is common practice to include along with the impurity diffusion source a suitable source of the volatile element as well.

After the diffusion annealing process is completed, the sealed ampoule is removed from the furnace and cut open. Conventionally, a circular saw is used to cut around the circumference of the ampoule to recover the diffused wafers. Specifically, the ampoule is rotated on its own axis and moved forward toward the rotating blade of the circular saw.

A disadvantage of known closed tube diffusion processes is that the necessary cutting step to open the ampoule tends to break the wafers. Wafer holders used in the open tube diffusion process are not applicable to the closed tube diffusion process since such holders are not designed to hold wafers securely during rotation of the ampoule which is necessary for cutting open the sealed ampoule in the closed tube diffusion process. While vertical slot holders may be used with appropriately larger ampoules and larger furnace tubes, they are not easily adapted for restricted ampoule sizes with smaller diameter furnace tube designs, which are generally used based on thermal considerations. In such cases, accommodating several wafers vertically leads to the problem of restricted flow of the vapor phase and hence the impurity density available in the vapor phase for diffusion into multiple wafers is not uniform.

There is, therefore, a need for a wafer holder for use in closed tube diffusion annealing processes which alleviates at least to some extent the aforementioned disadvantages.

SUMMARY

The present invention provides a wafer holder that includes a hollow holder body having an upper portion and a lower portion and a longitudinal axis extending between a first and a second end. The holder body includes a plurality of first slots and a plurality of second slots. At least the first slots slope from the upper portion to the lower portion toward the first end and are angled relative to the longitudinal axis.

The present invention further provides a diffusion annealing apparatus which includes a hollow ampoule having a pair of ends and a wafer holder including a hollow holder body having a longitudinal axis. The ampoule is adapted to be sealed at each of the ends. The holder body has an upper portion and a lower portion and a longitudinal axis extending between a first and a second end. The holder body includes a plurality of first slots and a plurality of second slots, at least the first slots sloping from the upper portion to the lower portion toward the first end thus being angled relative to the longitudinal axis.

The present invention further provides a diffusion annealing system. The system includes a diffusion source comprising an impurity, a heat source, and an annealing apparatus. The diffusion apparatus includes a hollow ampoule having a pair of ends, and a wafer holder positioned within the ampoule. Each of the ends is sealed. The wafer holder includes a hollow holder body having a longitudinal axis. The holder body has an upper portion and a lower portion and a longitudinal axis extending between a first and a second end. The holder body also includes a plurality of first slots and a plurality of second slots, at least the first slots sloping from the upper portion to the lower portion toward the first end thus being angled relative to the longitudinal axis.

The present invention further provides a method of diffusion annealing a plurality of wafers. The method includes heating a sealed ampoule housing a diffusion source having an impurity in a first region and a wafer holder holding a plurality of pairs of wafers each in a first slot in a second region and diffusing the impurity throughout the ampoule. The first slots are again angled relative to a longitudinal axis of the ampoule.

The foregoing and other advantages and features of the invention will be more readily understood from the following detailed description of preferred embodiments, which is provided in connection with the accompanying drawings.

DETAILED DESCRIPTION OF PREFERRED EMBODIMENTS

Figure 1:
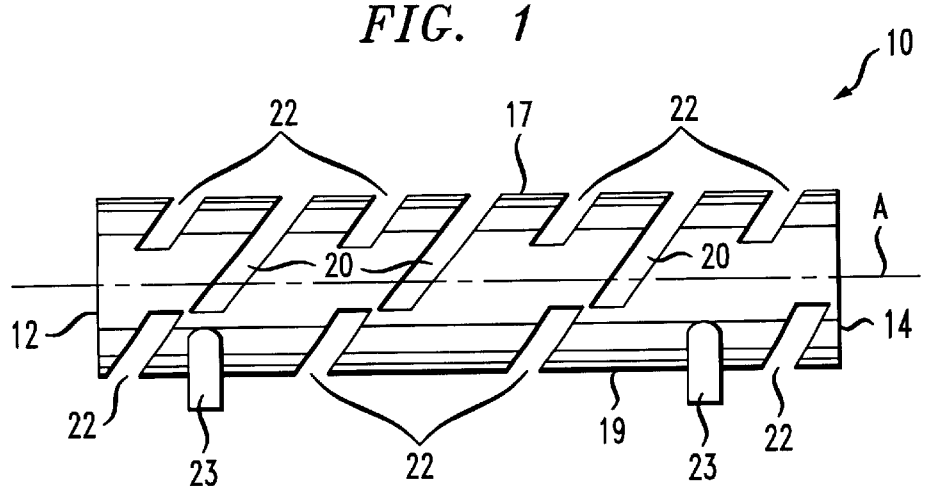
FIG. 1 is a side view of a wafer holder constructed in accordance with an embodiment of the invention.
Figure 2:
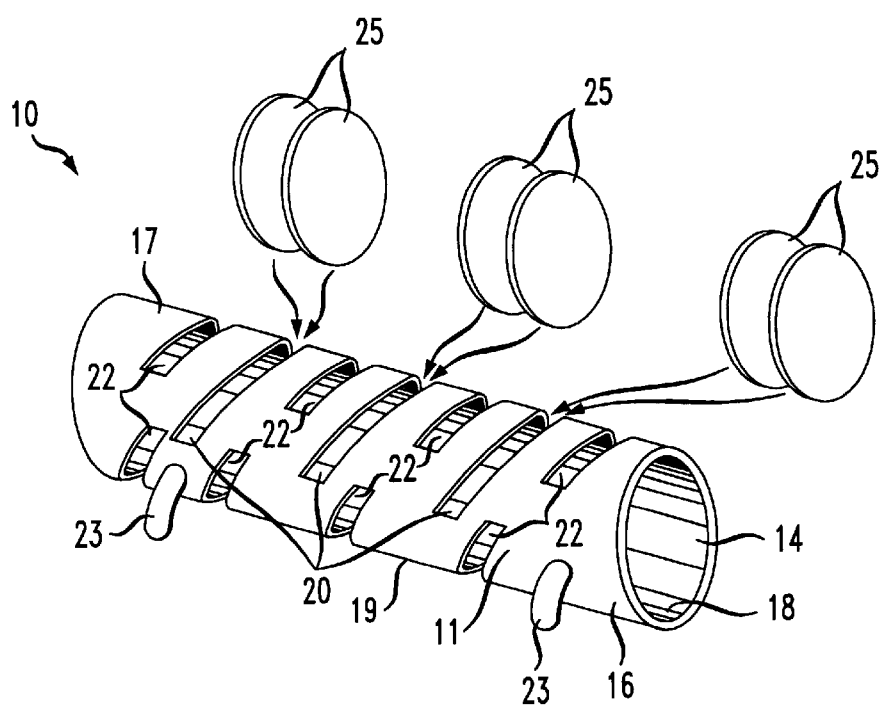
FIG. 2 is a perspective view of the wafer holder of FIG. 1.

FIGS. 1 and 2 illustrate a wafer holder 10 having a holder body 11 with a longitudinal axis A. The holder body 11 extends between a first end 12 and a second end 14. The illustrated holder body 11 is generally cylindrical and has an outer surface 16 and an inner surface 18. Further, the holder body 11 includes an upper portion 17 and a lower portion 19. A plurality of legs 23 extend from the lower portion 19 and allow the holder body 11 to stand within an ampoule 40 (described in detail below) with a space between the outer extent of the holder body 11 and the inner diameter of the ampoule 40. Although the holder body 11 is illustrated as being cylindrical, this is not critical and it may have other non-cylindrical shapes.

Preferably, the holder body 11 is formed of a material which is stable at the diffusion temperature, does not contribute to the impurities, does not attract impurities, and is cleanable and reusable. Examples of material which may be used to form the holder body include quartz, silicon carbide, aluminum oxide, zirconium oxide, magnesium oxide, diamond, and other like materials.

Figure 3:
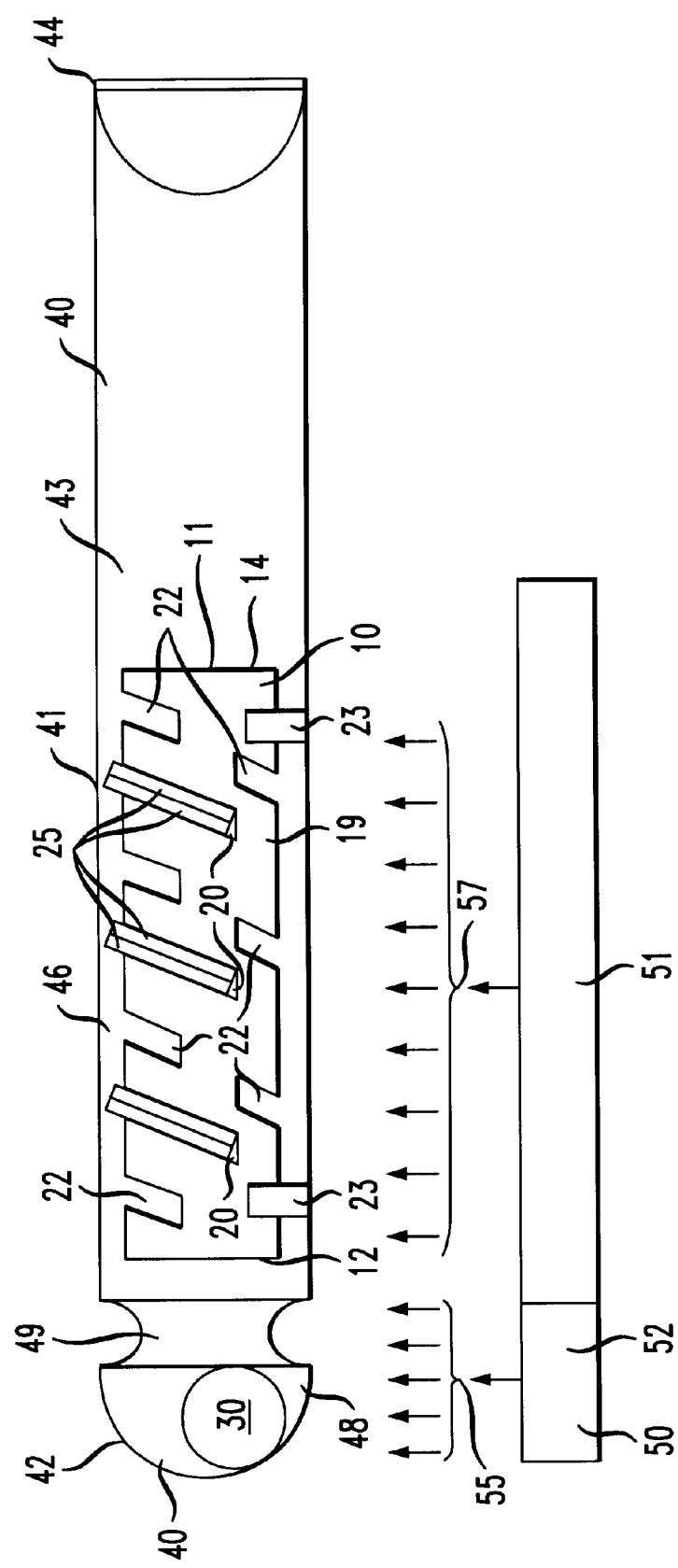
FIG. 3 is a side view of an ampoule used with the wafer holder of FIG. 1.

A plurality of slots 20, 22 are located along the holder body 11. As illustrated, the slots 20 extend further around the outer surface 16 than the slots 22. However, the slots 22 may extend around the outer surface 16 as far as the slots 20. Each of the slots 20 are sized and configured to accommodate a pair of semiconductor wafers, such as wafers 25. Depending upon the size of the wafers 25, each pair of wafers 25 fit within a respective slot 20 with a portion of each of the wafers 25 protruding beyond the outer surface 16 of the holder body 11 (FIG. 3). Some of the slots 22 extend from the upper portion 17 and some of the slots 22 extend from the lower portion 19.

Figure 4:
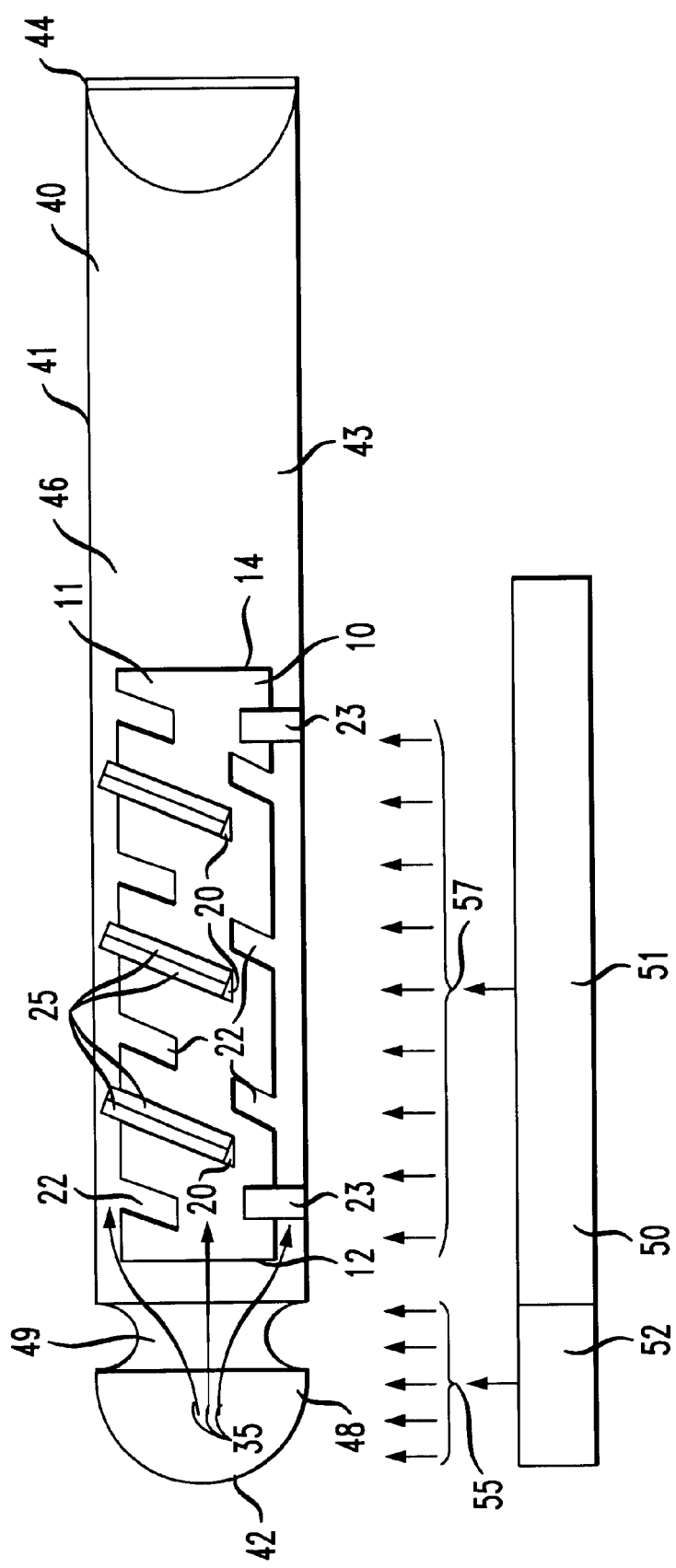
FIG. 4 is another side view of the ampoule of FIG. 3.
Figure 5:
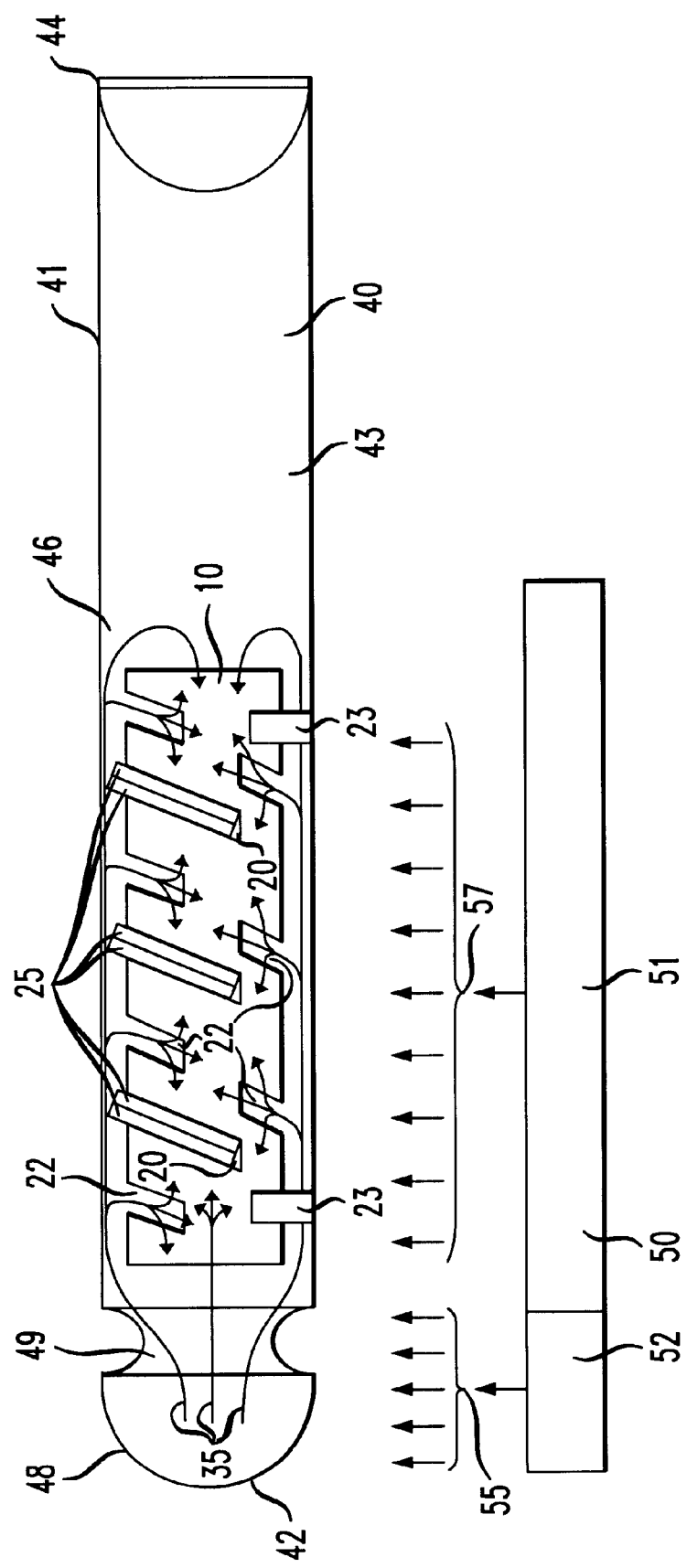
FIG. 5 is another side view of the ampoule of FIG. 3.

FIGS. 3–5 illustrate an ampoule 40 which is used with the wafer holder 10 in a diffusion annealing process. Only three slots 22 extending up from the lower portion 19 are shown in FIGS. 3–5 for clarity of illustration. The illustrated ampoule 40 is formed of quartz, and thus to some degree transparent. The ampoule 40 includes a hollow, generally cylindrical body or vessel 41 having an interior space 43 with an enclosed first end 42 and an open second end sealable with an end cap 44. The interior space 43 of the ampoule 40 is separable into a first region 48 and a second region 46. Specifically, the first region 48 is separated from the second region 46 by a narrower diameter region 49. The second region 46 is adapted to receive the wafer holder 10 holding one or more of the wafers 25. The first region 48, shown closest to the end 42, is adapted to receive a diffusion source, preferably in solid form, such as a solid diffusion source 30. The solid diffusion source 30 includes impurities which are to be diffused throughout the ampoule 40 into all the wafers 25 via the solid-vapor equilibrium of the diffusion source. The impurities within the diffusion source 30 may include one or more from the group consisting of sulfur, tellurium, antimony, arsenic, boron, cadmium, gallium, indium, phosphorous and zinc.

As shown in FIGS. 3–5, the wafer holder 10 holding the pairs of wafers 25 fits within the second region 46 of the ampoule 40 with a small clearance between the wafers 25 and the ampoule body 41. Preferably, as will be described in detail below, the clearance should be at a minimum in the range of about three to five millimeters.

As illustrated in FIGS. 1–5, the slots 20, 22 are angled relative to the longitudinal axis A, sloping toward the first end 12 from the upper portion 17 to the lower portion 19. By angling the slots 20, the wafers 25 having a diameter nearly as large as the inside diameter of the ampoule 40 can be placed within the ampoules 40. Preferably, the slots 20 are at an angle allowing wafers 25 having a diameter slightly less than the inner diameter of the ampoule body 41 to fit within the ampoule body 41 with the noted small clearance. For example, the slots 20 may be angled to allow wafers 25 having a diameter of two inches (50 millimeters) to fit within the ampoule body 41 having an inside diameter of 2.125 inches (53 millimeters).

Figure 7:
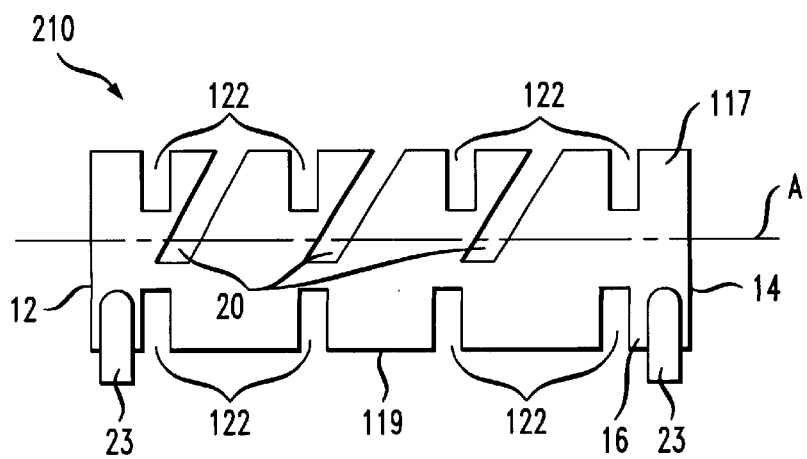
FIG. 7 is a side view of a wafer holder constructed in accordance with another embodiment of the invention.

FIG. 7 illustrates another embodiment by showing a wafer holder 210 which has the angled slots 20 interspersed between slots 122 which are parallel to the first and second ends 12, 14. Some of the slots 122 extend from an upper portion 117, while other of the slots 122 extend from a lower portion 119.

A preferred angle of the slots 20 is approximately forty-five degrees relative to the longitudinal axis A. A forty-five degree angle generally provides a secure holding structure for the wafers 25 during the diffusion annealing process and during the subsequent cutting of the ampoule body 41. Further, as will be described in detail below, in addition to allowing wafers 25 with diameters nearly equal to the inner diameter of the ampoule body 41 to fit within the ampoule body 41, the inclination of the slots 20 improves the migration and the uniformity of the diffusion of the impurities.

A heat source 50, such as, for example, a furnace is used to impart heat to the ampoule 40. The heat serves a dual purpose of changing the physical state of the solid diffusion source 30 and assisting in a uniform diffusion of the impurities throughout the ampoule 40.

The illustrated heat source 50 is capable of heating portions of the ampoule 40 to varying temperatures. Specifically, the heat source 50 has a first heating region 52 and a second heating region 51. The first heating region 52 imparts a first heat regime 55 on the first region 48 of the ampoule 40, while the second heating region 51 imparts a second heat regime 57 on the second region 46. The first heat regime 55 should raise the temperature within the first region 48 to a temperature $T_1$ and the second heat regime 57 should raise the temperature within the second region 46 to a temperature $T_2$. The temperature $T_1$ must be sufficiently high to allow the solid diffusion source 30 to establish equilibrium with its vapor phase to provide a gaseous diffusion source 35 (FIGS. 4–5).

In addition, to prevent condensation of the vapor phase on the wafers 25, the temperature $T_2$ at the wafers 25 in the second region 46 should be slightly higher than the temperature $T_1$ of the source 30 located in the first region 48. Upon the diffusion source 30 turning into the gaseous diffusion source 35, the concentration of the impurities within the gaseous diffusion source 35 is predominantly in the first region 48. Thus, there is initially a concentration gradient between the first region 48 and the second region 46. The concentration gradient leads to transport of the impurities entrained within the gaseous diffusion source 35 from the first region 48 to the second region 46, as shown in FIG. 4.

Further, since $T_2$ is slightly greater than $T_1$ (on the order of one to two degrees Centigrade), a positive temperature gradient exists from the region 48 to the region 46. This temperature gradient serves to push the flow of the gaseous diffusion source 35 back toward the first region 48. Eventually the concentration gradient will tend toward zero. However, the temperature gradient has been imposed on the ampoule 40 from the outside heat source 50, and so the outside temperature gradient will remain constant as long as the heat source 50 continues to maintain the two heat regimes 55, 57. The competing actions of these two gradients lead to a more uniform diffusion of the impurities by establishing a continuous reflux action to the migration of the impurities in the vapor phase.

The clearance between the wafers 25 and the ampoule body 41 assists in the diffusion of the impurities by creating a large enough passage for the impurities to migrate freely through the first region 46. Additionally, the slots 22 provide additional passages for the migration of impurities (FIG. 5). The combination of the slots 22, the inclination of the wafers 25, and the competing actions of the concentration and temperature gradients all lead to the maintenance of a more uniform doping of the wafers 25 and a more uniform dopant diffusion depth throughout the wafers 25 located in the first region 46.

The number of slots 20, and hence the number of wafers 25, that can be diffusion annealed together is dependent upon the temperature used, the size and configuration of the heat source 50, the size of the wafers 25, the size of the ampoule 40, and the spacing between the slots 20. The spacing is itself a function of the mean free path of the species in the gaseous diffusion source 35.

Figure 6:
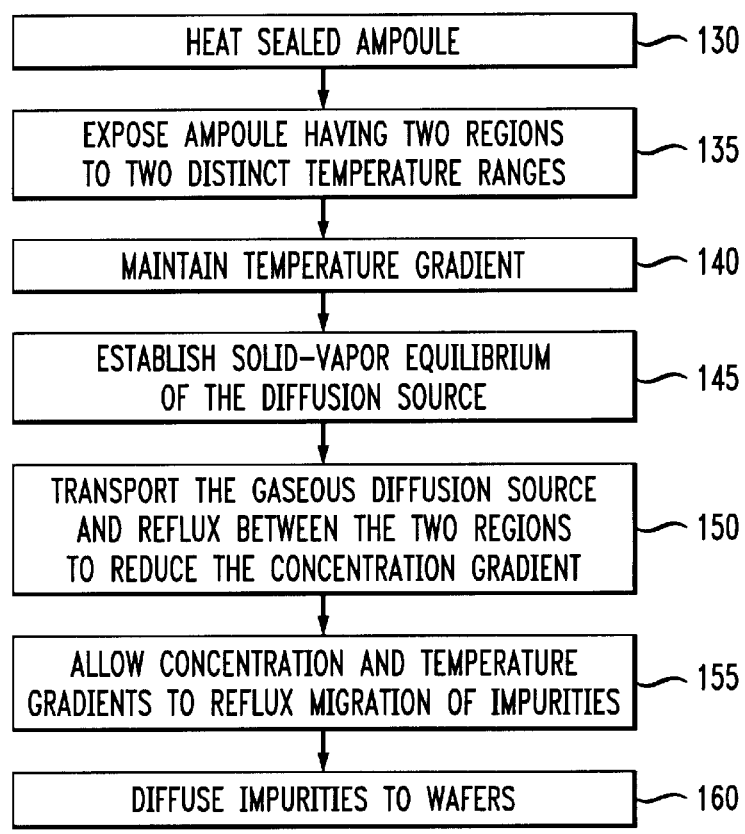
FIG. 6 is a flow diagram of the steps for diffusion annealing a plurality of wafers using the FIG. 3 ampoule containing a FIG. 1 wafer holder according to an embodiment of the invention.

FIG. 6 provides a flow diagram of a method for diffusing impurities into the semiconductor wafers 25. After placing the ampoule 40 (housing the wafer holder 10, the wafers 25, and the solid diffusion source 30) within or in direct proximity to the heat source 50, the ampoule 40 is heated at step 130. The heating of the ampoule 40 includes exposing the ampoule 40 to the two heating regimes 55, 57 to create a temperature gradient $T_1:T_2$ between the two regions 46, 48 at step 135. The two heating regimes 55, 57 are maintained at step 140.

Through heating the ampoule 40, a solid-vapor equilibrium of the diffusion source 30, 35 is established at step 145. The establishment of the solid-vapor equilibrium, caused upon $T_1$ being raised to a sufficient temperature, begins the transport of the gaseous diffusion source 35 to the second region 46 at step 150. At this point in the process, there is a concentration gradient between the two regions 46, 48, with most of the impurities in the first region 48. The impurities are transported with the diffusion source 35 from high concentration to low concentration region, i.e., from the first region 48 to the second region 46. Reflux between the two regions 46, 48 reduces the concentration gradient, also at step 150. The presence of the concentration and temperature gradients causes a reflux of the vapor, thus more uniformly diffusing the impurities throughout the first region 46 at step 155. The impurities are transported to the wafers 25. Extended heating, for a period of time from twenty-five minutes to two hours or more will diffuse the impurities into the wafers 25 at step 160.

While the foregoing has described in detail preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. For example, although four slots 22 extending from the upper portion 17 and interspersed with three slots 20 have been illustrated as part of the wafer holder 10, the number and positions of the slots 20, 22 may vary. Further, while an approximately forty-five degree angle of inclination is denoted as preferable for the slots 20, other angles which still afford protection to the wafers 25 during diffusion and during the cutting of the ampoule 40 may be used. Accordingly, the invention is not to be seen as limited by the foregoing description, but is only limited by the scope of the appended claims.

What is claimed as new and desired to be protected by Letters Patent of the United States is:

1. A tubular wafer holder comprising:
   a holder body having an interior space, an upper portion and a lower portion and a longitudinal axis extending between a first and a second end, wherein said holder body includes a plurality of first slots capable of holding wafers and a plurality of second slots, at least said first slots sloping from said upper portion to said lower portion toward said first end and being angled relative to the longitudinal axis at an angle sufficient to hold such wafers securely during rotation of the holder body on such axis, and said plurality of second slots being adapted to allow gaseous material to enter said interior space.

2. The wafer holder of claim 1, wherein said holder body comprises quartz.

3. The wafer holder of claim 1, wherein said first slots have a greater length along a circumference of said holder body than said second slots.

4. The wafer holder of claim 3, wherein each said first slot is sized and shaped to receive a semiconductor wafer.

5. The wafer holder of claim 4, wherein each said first slot is located between a pair of said second slots.

6. The wafer holder of claim 5, wherein said first slots are at an angle of approximately forty-five degrees relative to the longitudinal axis.

7. The wafer holder of claim 1, wherein said second slots slope from said upper portion to said lower portion toward said first end and are angled relative to the longitudinal axis.

8. The wafer holder of claim 1, wherein said second slots are parallel to said first and second ends and perpendicular to said longitudinal axis.

9. An ampoule assembly, comprising:
   a hollow ampoule having a pair of ends, one of which is sealed and the other of which is adaptable to being sealed; and
   a tubular wafer holder including a holder body having an interior space, an upper portion and a lower portion and a longitudinal axis extending between a first and a second end, wherein said holder body includes a plurality of first slots capable of holding wafers and a plurality of second slots, at least said first slots sloping from said upper portion to said lower portion toward said first end and being angled relative to the longitudinal axis at an angle sufficient to hold such wafers securely during rotation of the holder body on such axis, and said plurality of second slots being adapted to allow gaseous material to enter said interior space.

10. The assembly of claim 9, wherein said holder body comprises a material which is stable at diffusion temperature.

11. The assembly of claim 10, wherein the material forming said holder body is cleanable and reusable.

12. The assembly of claim 11, wherein the material forming said holder body comprises quartz.

13. The assembly of claim 11, wherein the material forming said holder body comprises silicon carbide.

14. The assembly of claim 11, wherein the material forming said holder body comprises aluminum oxide.

15. The assembly of claim 11, wherein the material forming said holder body comprises zirconium oxide.

16. The assembly of claim 11, wherein the material forming said holder body comprises magnesium oxide.

17. The assembly of claim 9, wherein said ampoule comprises a first and a second region, said first region being adapted to receive a diffusion source comprising an impurity and said wafer holder being positioned in said second region.

18. The assembly of claim 17, wherein said first and second slots have an equal length around a circumference of said holder body.

19. The assembly of claim 17, wherein said first slots have a greater length around a circumference of said holder body than said second slots.

20. The assembly of claim 19, wherein each said first slot is sized and shaped to receive a pair of semiconductor wafers.

21. The assembly of claim 20, wherein said second slots are configured and placed to assist in the diffusion of said impurity in said second region.

22. The assembly of claim 21, wherein each said first slot is located between a pair of said second slots.

23. The assembly of claim 22, wherein said first slots are angled to enable one said wafer holder holding one or more wafers to be positioned in said ampoule.

24. The assembly of claim 23, wherein one said wafer holder holding at least one wafer fits within said ampoule with a clearance between the wafer and the ampoule in the range of about three to about five millimeters.

25. The assembly of claim 24, wherein said slots are at an angle of approximately forty-five degrees relative to said longitudinal axis.

26. The assembly of claim 9, wherein said second slots slope from said upper portion to said lower portion toward said first end and are angled relative to the longitudinal axis.

27. The assembly of claim 9, wherein said second slots are parallel to said first and second ends and perpendicular to said longitudinal axis.

28. A diffusion annealing system, comprising:

a diffusion source comprising an impurity;

a heat source; and an annealing apparatus, including:
    a hollow ampoule having a pair of ends, one of which is sealed and the other of which is adaptable to being sealed; and
    a tubular wafer holder positioned within said ampoule, said wafer holder including a holder body having an interior space, an upper portion and a lower portion and a longitudinal axis extending between a first and a second end, wherein said holder body includes a plurality of first slots capable of holding wafers and a plurality of second slots, at least said first slots sloping from said upper portion to said lower portion toward said first end and being angled relative to the longitudinal axis at an angle sufficient to hold such wafers securely during rotation of the holder body on such axis, and said plurality of second slots being adapted to allow gaseous material to enter said interior space.

29. The system of claim 28, wherein said ampoule comprises a first and second region, said diffusion source being positioned in said first region and said wafer holder being positioned in said second region.

30. The system of claim 29, wherein said heat source is adapted to heat said first region to a first temperature and said second region to a second temperature.

31. The system of claim 30, wherein said second temperature is higher than said first temperature.

32. The system of claim 31, wherein a temperature differential between said first and second temperatures is no more than about two degrees Centigrade.

33. The system of claim 30, wherein said first temperature is sufficient to allow diffusion of said impurity from said diffusion source throughout said ampoule.

34. The system of claim 28, wherein said diffusion source comprises one or more of the group consisting of sulfur, tellurium, antimony, arsenic, boron, cadmium, gallium, indium, phosphorous and zinc.

35. The system of claim 28, wherein said first and second slots have an equal length around a circumference of said holder body.

36. The system of claim 28, wherein said first slots have a greater length around a circumference of said holder body than said second slots.

37. The system of claim 36, wherein each said first slot is sized and shaped to receive a pair of wafers.

38. The system of claim 37, wherein said second slots are configured and placed to assist in the diffusion of said impurity in said first region.

39. The system of claim 38, wherein each said first slot is located between a pair of said second slots.

40. The system of claim 37, wherein said first slots are angled relative to said longitudinal axis to enable one said wafer holder holding one or more wafers to be positioned in said ampoule.

41. The system of claim 40, wherein one said wafer holder holding at least one wafer fits within said ampoule with a clearance between the wafer and the ampoule in the range of about three to about five millimeters.

42. The system of claim 40, wherein said slots are at an angle of approximately forty-five degrees relative to the longitudinal axis.

43. The system of claim 28, wherein said second slots slope from said upper portion to said lower portion toward said first end and are angled relative to the longitudinal axis.

44. The system of claim 28, wherein said second slots are parallel to said first and second ends and perpendicular to said longitudinal axis.

* * * * *